United States Patent [19]

Umatate et al.

[11] Patent Number: 5,243,377
[45] Date of Patent: Sep. 7, 1993

[54] LITHOGRAPHY INFORMATION CONTROL SYSTEM

[75] Inventors: Toshikazu Umatate, Kawasaki; Tadashi Yamaguchi, Yokohama, both of Japan

[73] Assignee: Nikon Corporation, Tokyo, Japan

[21] Appl. No.: 861,034

[22] Filed: Mar. 31, 1992

[30] Foreign Application Priority Data

Apr. 2, 1991 [JP] Japan .................................. 3-69800

[51] Int. Cl.$^5$ .......................................... G03B 27/42
[52] U.S. Cl. ....................................... 355/53; 355/46; 355/204; 355/208
[58] Field of Search .................... 355/53, 208, 204, 46

[56] References Cited

U.S. PATENT DOCUMENTS

| | | | |
|---|---|---|---|
| 4,314,334 | 2/1982 | Daughton et al. | |
| 4,676,649 | 6/1987 | Phillips | 355/53 |
| 4,757,355 | 7/1988 | Iizuka et al. | 355/53 |
| 4,780,617 | 3/1988 | Umatate et al. | 250/548 |
| 4,908,656 | 9/1990 | Suwa et al. | 355/53 |

FOREIGN PATENT DOCUMENTS 0313013 4/1989 European Pat. Off. .

OTHER PUBLICATIONS

Van Den Brink, M. A. et al., "Matching Management of Multiple Wafer Steppers Using A Stable Standard and A Matching Simulator", *Proceedings of SPIE*, vol. 1087, (1989), pp. 218-232.

*Primary Examiner*—Monroe H. Hayes
*Attorney, Agent, or Firm*—Shapiro and Shapiro

[57] ABSTRACT

A lithography system comprises an information gathering apparatus for gathering specific information set in each of plural exposure apparatus and variable according to operating conditions of each of the plural exposure apparatus in response to masks to be used in each of the plural exposure apparatus and substrates supplied thereto, or information obtained by measuring or evaluating the process state of a substrate processed by each of the plural exposure apparatus, independently from the control by a process control apparatus for controlling supply of the masks, supply of plural substrates to be exposed in each of the plural exposure apparatus, and operating conditions of each of the plural exposure apparatus in response to the masks and substrates supplied thereto. The lithography system further comprises a system observer apparatus capable of modifying or correcting a part of working paremeters set in each of the exposure apparatus, based on the gathered information, in such a manner that the operating conditions set by the process control apparatus can be stably maintained, independently from the control of the process control apparatus.

5 Claims, 6 Drawing Sheets ived, through said channel, to personal computers PC1, PC2, ..., PCn which constitute computers of an intermediate rank and are connected to the host computer H·COM of the upper rank. Said host computer H·COM instructs the personal computers PC1, ..., PCn to execute exposures of wafers with predetermined reticles, and executes the management of entire lithographic process (including wafer logistics management and reticle management) by receiving the information on completed steps from said personal computers.

LITHOGRAPHY INFORMATION CONTROL SYSTEM

BACKGROUND OF THE INVENTION

1. Field of the Invention

The present invention relates to a management system for collectively controlling various information in a lithographic process employing plural exposure apparatus, and also to the control of exposure apparatus and correction of various information.

2. Related Background Art

The manufacturing process of semiconductor devices or liquid crystal display devices generally contains so-called lithographic process. Such lithographic process is generally an optical process, which starts from coating of a semiconductor wafer or a glass plate with a photosensitive material (photoresist) with a thickness of about 1 μm, and ends with exposure of said photoresist layer to a mask pattern and development of said photoresist layer.

In the device producing sites, a step of coating the substrate with photoresist and a step of developing the substrate after exposure are mostly conducted in an apparatus called coater-developer, and an exposure apparatus is used for transferring a mask pattern onto the substrate coated with photoresist, with precise alignment and with a predetermined resolving power.

In mass production lines for devices, the coater-developer and the exposure apparatus are integrated as an in-line structure. The operator is therefore only required to set a cassette, containing plural unprocessed substrates, into the coater-developer, and all the subsequent steps are conducted automatically.

Also in such production lines, plural exposure apparatus (and coater-developers) are used in parallel manner, in order to improve the efficiency of mass production. In such configuration, in order to improve the working rate of each exposure apparatus, the plural exposure apparatus in a line are collectively controlled by a host computer which overrides the computers in said exposure apparatus.

FIG. 1 is a block diagram schematically showing an example of conventional collective control, wherein blocks EXP1, EXP2, ..., EXPn indicate exposure apparatus, and blocks CD1, CD2, ..., CDn indicates coater-developers. Each exposure apparatus EXPn is provided therein with a controlling computer CMP·En, while each coater-developer CDn is provided with a controlling computer CMP·Cn. Also each exposure apparatus EXPn is provided with a reticle library RLn containing predetermined plural reticles (masks), and a necessary reticle is automatically loaded according to the instruction by the computer CMP·En. The coater-developers CDn are equipped with libraries WCL1, WCL2, ..., WCLn each containing predetermined lots of wafers (usually 25 wafers in a lot) in the units of cassette. In fully automated production lines, however, an automatic transportation robot loads the wafer cassette in automatic manner to a coater-developer which becomes available earliest in time, so that said wafer cassette library WCLn need not necessarily be integrated as an in-line structure with the respective coater-developer.

The computers CMP·En of the exposure apparatus EXPn and those CMP·Cn of the coater-developers CDn are provided with communication function for example utilizing a RS232C channel, and are connected, through said channel, to personal computers PC1, PC2, ..., PCn which constitute computers of an intermediate rank and are connected to the host computer H·COM of the upper rank. Said host computer H·COM instructs the personal computers PC1, ..., PCn to execute exposures of wafers with predetermined reticles, and executes the management of entire lithographic process (including wafer logistics management and reticle management) by receiving the information on completed steps from said personal computers.

The personal computers PC1-PCn optimize the processes of the coater-developer CDn and the exposure apparatus EXPn according to the instructions from the host computer H·COM, and send, to the host computer H·COM, information on the completed steps and on troubles in the steps. For total management of the IC device production, the host computer H·COM effects the management of supply of wafers and reticles (logistics management) according to the device to be manufactured, and the calculation of throughput in each exposure apparatus, and controls the entire operation so as to maximize the work rate of each exposure apparatus constituting the production line.

The exposure apparatus employed in the lithographic process lines as shown in FIG. 1 are mostly reduction projection steppers which project the reticle pattern in a reduced size of 1/5 (or 1/10). With the recent development of finer patterns in the semiconductor devices, the precision of manufacture required for the steppers is becoming stricter year after year, and the performance margin (difference between the precision guaranteed by the specifications and the practical precision achievable in stable manner) of the steppers is becoming gradually smaller.

For these reasons, there is being required more refined control enabling, for example:

(A) to collect the details of status of the apparatus (EXPn, CDn) in order to maintain the performance thereof in optimum state;

(B) to restore the performance of the apparatus promptly in case the deterioration in performance is detected; and (C) to optimize the process parameters for each apparatus or for each lot.

These requirements are only representative ones, but the management of these factors requires gathering, analysis and feedback of enormous data, including the measured performance of various apparatus and the data representing the status during the process.

These operations are practically impossible to execute manually, and the incorporation of the above-mentioned functions (A), (B) and (C) into the host computer H·COM will result in the following difficulties:

(1) The amount of data to be gathered is excessively large for the capacity of communication channel of the host computer H·COM designed for production management;

(2) As the host computer is generally designed to control all the process steps, it is generally difficult to incorporate a software for managing and analyzing the detailed data specific to the apparatus solely in the part of lithographic process. It is also difficult to promptly achieve an increase in the number of data items and an improvement in the analyzing algorithm, because of the implication with other managing functions; and (3) The load of the host computer is inevitably increased, thus limiting other managing functions.

SUMMARY OF THE INVENTION

In consideration of the foregoing, an object of the present invention is to provide an information control system for lithographic process, not dependent on the management system of the host computer.

Another object of the present invention is to provide a system capable of gathering and managing various information involved in the exposure apparatus in the lithographic process, independently from the control by the host computer.

Still another object of the present invention is to provide a system capable of detailed control at least on the exposure apparatus, while enabling the user to select an arbitrary structure in the conventional production management system employing host computer.

Still another object of the present invention is to provide, in a production line with plural exposure apparatus, a system enabling pilot exposure process for individually setting the work conditions of each exposure apparatus, independently from the host computer.

Still another object of the present invention is to provide a system able to correct, among the work conditions of the exposure apparatus determined by the host computer, parameters influencing the precision of alignment independently from the management system of said host computer.

The configuration of the present invention, for attaining the above-mentioned objects, to be clarified in detail by the following embodiments, makes it possible to flexibly optimize the various process parameters of the exposure apparatus in the lithographic process, while minimizing the interference with the conventional process management system employing the host computer.

It is thus rendered possible to stably maintain the lithographic process including the exposure steps.

DESCRIPTION OF THE PREFERRED EMBODIMENTS

Figure 2:
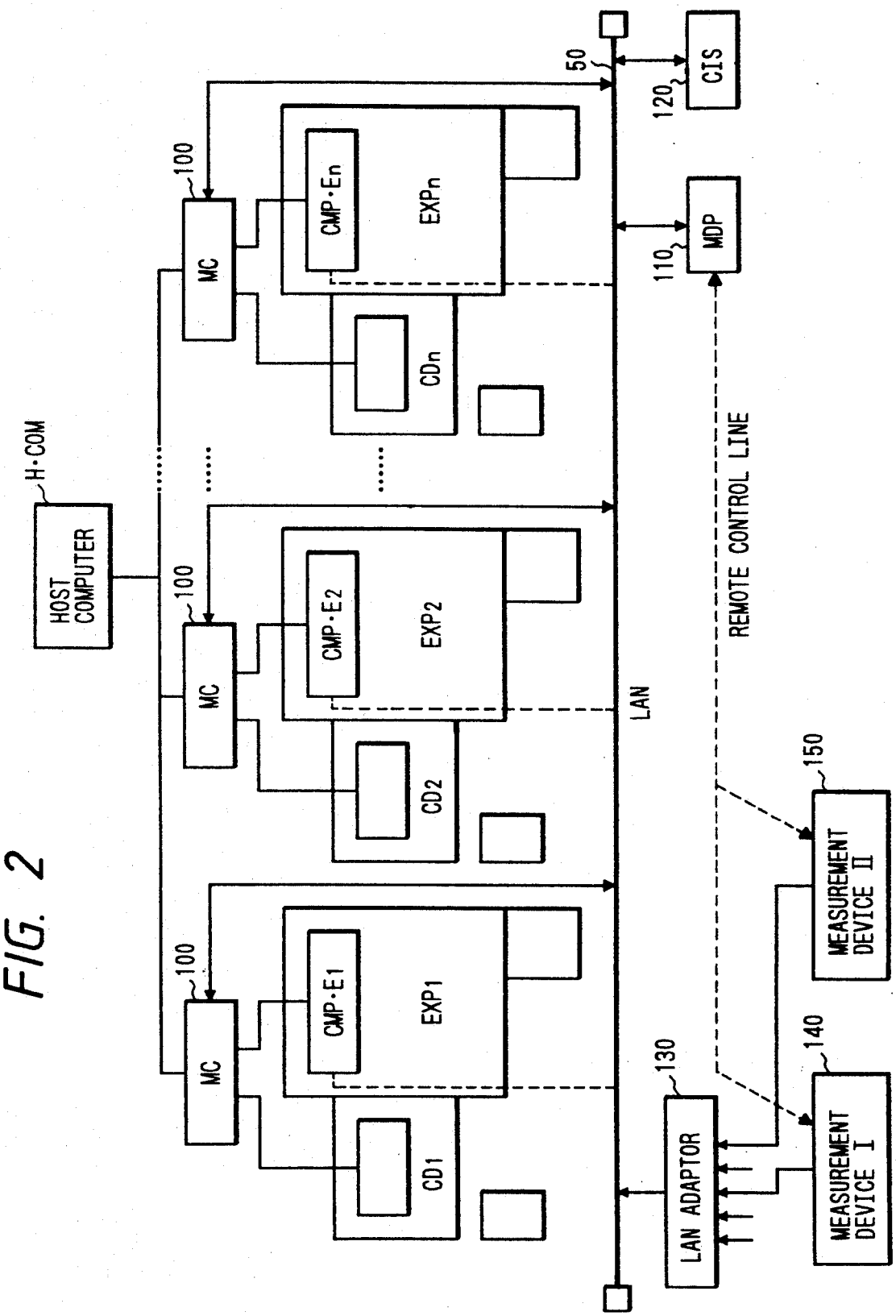
FIG. 2 is a block diagram of a lithography information control system embodying the present invention.

FIG. 2 illustrates the entire structure of a lithography information control system embodying the present invention, employing wafer steppers EXP1, EXP2, . . . , EXPn as the plural exposure apparatus, in a similar manner to the conventional system. There are also employed a host computer H·COM and coater-developers CD1, CD2, . . . , CDn as in the conventional system.

In the present embodiment, there is employed a local area network (LAN) 50 such as ether-net, for the communication among various apparatus, as shown in FIG. 2. Said LAN 50 may be that provided for use by the host computer H·COM in the lithographic process, or may be provided anew. Between the host computer H·COM and each exposure unit (a set of a stepper and a coater-developer) there is provided an exclusive machine controller (MC) 100. Said machine controller is equivalent in function to the conventional personal computer, but is provided additionally with a communication function by the LAN 50 and a function of information gathering from the stepper and the coater-developer.

A master data processor (MDP) 110 effects gathering and management of information on work state from the machine controllers 100, and transmission of various information thereto.

A central information server (CIS) 120 has the functions of editing and distribution of process programs for the steppers and information gathering, and, in the gathering and analysis of data on the stepper performance by the master data processor 110 based on the working state data collected thereby, provides the master data processor 110 with the history data required for modification or correction of the working parameters of the steppers. Said modification or correction is conducted in the master data processor 110. Also various measurement devices 140, 150 etc. are connected, through a LAN adaptor 130, to the LAN 50. Examples of said measurement devices include an automatic line width measuring device and a pattern coordinate measuring device, such as LAMPAS manufactured by Nikon Corp. These measurement devices are used for measuring the line width of a resist pattern on an exposed and developed wafer, or measuring the coordinate position of a specified resist pattern, and the measured data are supplied, through the LAN 50 or a memory medium, to the master data processor 110 or the CIS 120.

In the hardware configuration explained above, the CIS 120 can be positioned outside the clean room. As the measurement devices 140, 150 are generally installed in the clean room in which the steppers are located, the MDP 110 is advantageously installed also in the clean room for the convenience of remote control of such measurement devices.

In the system illustrated in FIG. 2, the communication between each exposure unit and the LAN 50 is conducted through the MC 100, but the computers CMP·E1–CMP·En in the steppers may be provided with the communicating function with the LAN 50. However, since said computer CMP·En in each stepper does not hold enough information on the wafer process, the exchange of data relating to the working parameters of the stepper correlated with the actual process is preferably conducted through the MC 100.

The principal services (softwares) incorporated in the above-explained system consists of following four categories:

(1) Auto set-up service for automatic setting of the working parameters of each stepper;

(2) Process program control service for centralized control of the program for setting the working conditions of the steppers and for distribution of said programs to the steppers;

(3) Centralized monitoring service for centralized control of the working status of the steppers and for maintenance of stable operations of the steppers by displaying such working status and storing the history of such working status; and (4) Performance analysis service for gathering the performance data for each stepper and estimating the working parameters of the stepper to be modified.

Among these four service functions, the present invention covers the functions (1), (3) and (4), among which particularly important is the auto set-up service.

Said auto set-up service (ASUS) is to preset principal functions of the stepper in order to optimize the precision and performance thereof, according to the wafer and reticle to be processed.

In the execution of said service, there is utilized the measuring function of the measurement devices 140, 150 shown in FIG. 2 and of an alignment sensor provided in the stepper EXPn.

Figure 1:
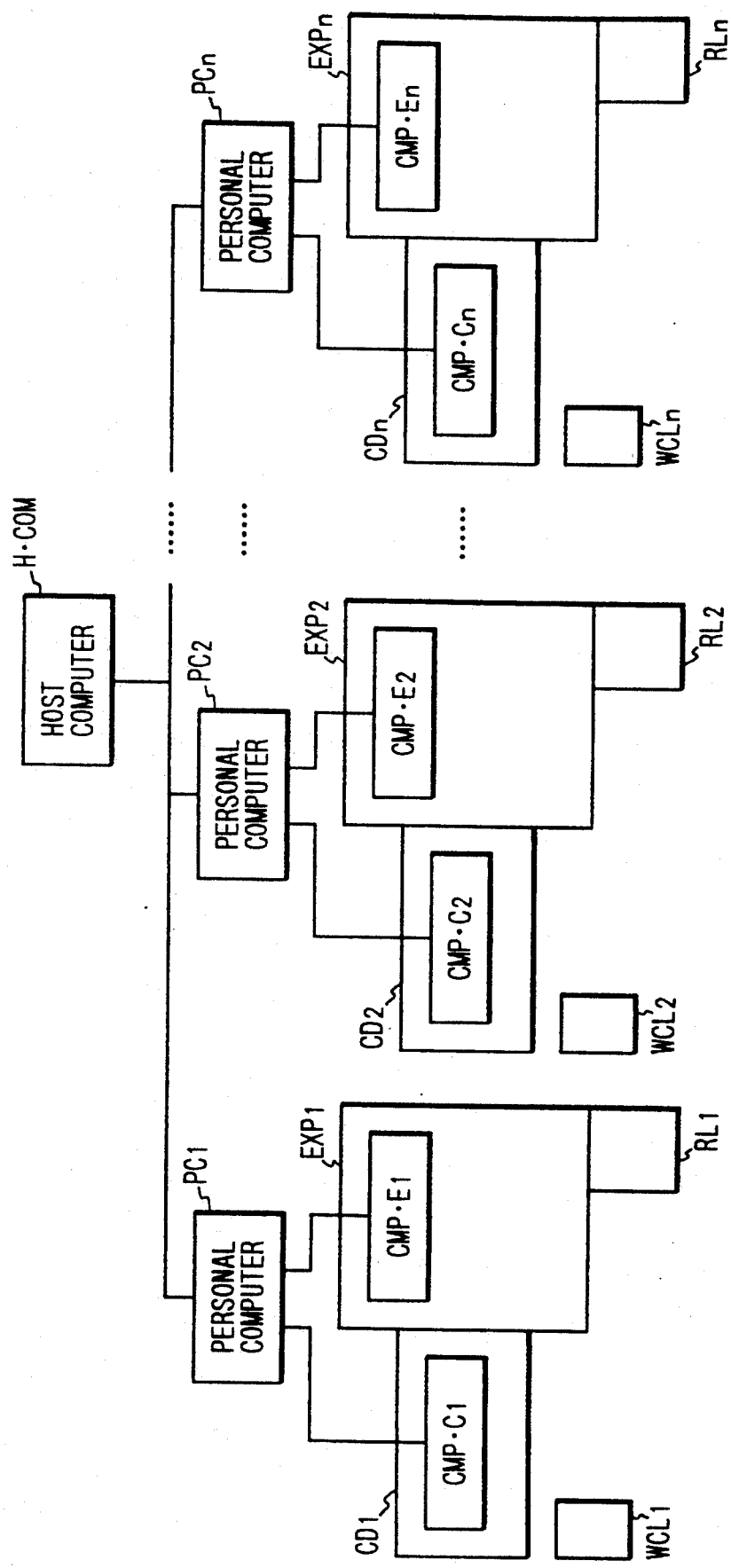
FIG. 1 is a block diagram of a conventional process control system employed in a production line for semiconductor devices.

In the following is explained the representative structure of the stepper EXPn and the coater-developer CDn, with reference to FIG. 3. A wafer to be processed is supplied from a wafer cassette library WCLn, shown in FIG. 1, then advanced through various sections (photoresist coating, prebake etc.) of the coater-developer CDn to a wafer loader WL for in-line connection, and further transported to a wafer stage WST of the stepper EXPn. After the exposure in the stepper, the wafer is transported through the wafer loader WL and the sections (wet development, drying etc.) of the coater-developer CDn, and returns to the library WCLn.

The stepper EXPn is equipped principally with an illuminating system ILS for illuminating a reticle R, a reticle stage RST, a projection lens PL, a wafer stage WST, a reticle alignment sensor RA, a TTL (through the lens) sensor LA for wafer alignment, and an off-axis wafer alignment sensor WGA, which are controlled by the computer CMP·En.

Figure 3:
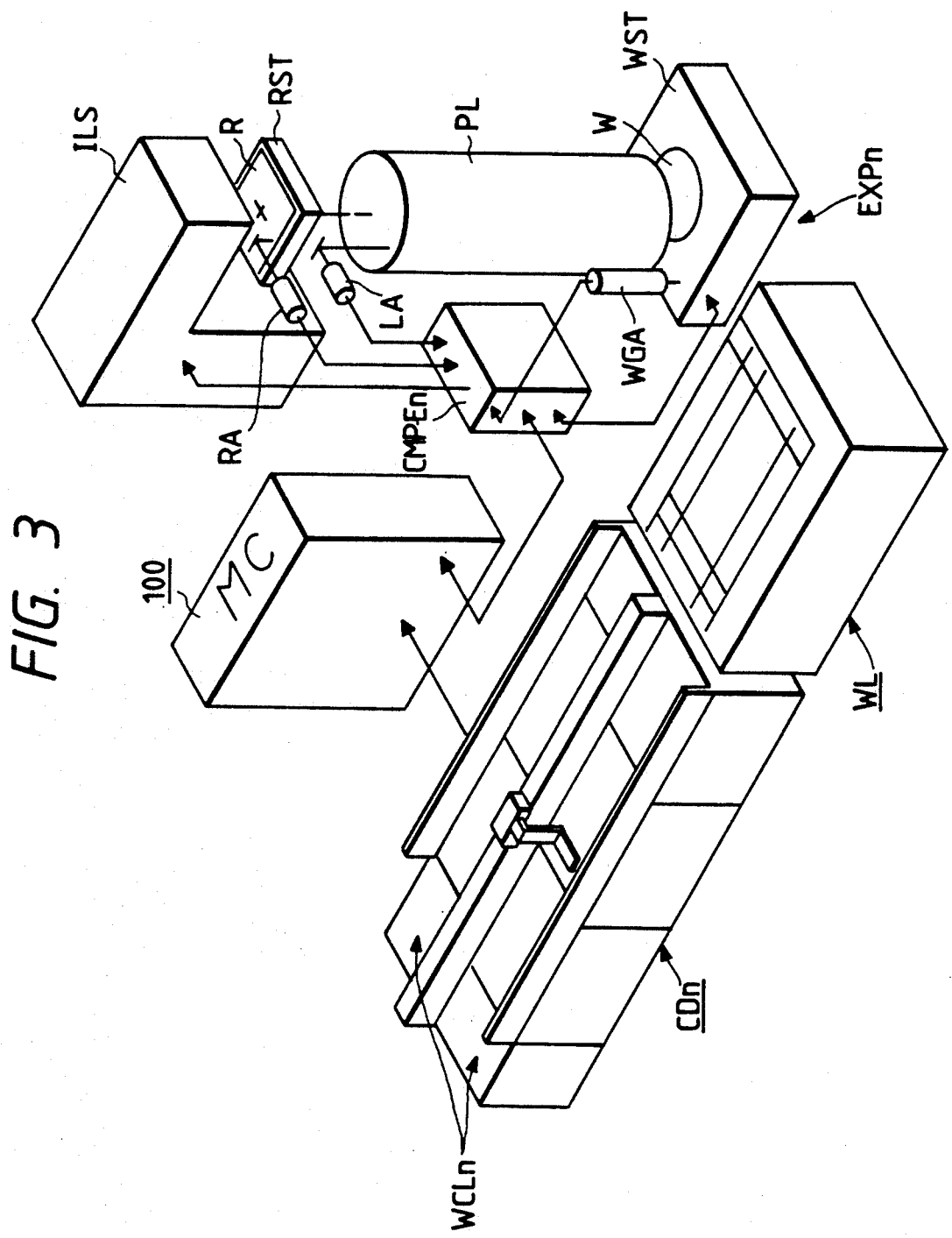
FIG. 3 is a perspective view showing the relationship between a stepper and a coater-developer.

It is to be noted that the system shown in FIG. 3 is merely an example, and does not represent all the lithography systems. For executing the auto set-up service in the system shown in FIG. 3, it is necessary to effect actual exposure on the first wafer, as a pilot wafer, of a lot containing 25 or 50 wafers, and to measure the result of process on said pilot wafer by the measurement device 140 or 150.

The master data processor 110 shown in FIG. 2 is actively involved in the process on said pilot wafer. In said MDP 110 there is accumulated information on the exposure process of the wafer lot, obtained from the host computer H·COM through the machine controllers 100. Therefore, the MDP 110 can identify the exposure unit in which said wafer lot is processed, and can set the measurement conditions. It is assumed that the measurement devices 140, 150 shown in FIG. 2 are used for the measurement, and the MDP 110 prepares and stores a measurement process program relating to the contents of measurement, control data on the measurement devices, criteria for judgment of the results of measurement etc. for each product (or wafer grade) and each process step. More specifically, the MDP 110 stores and manages a file MPPF defining the name of an exposure process program (prepared by the host computer) to which the wafer lot to be processed belongs and the content of the measurement process program corresponding to said wafer lot.

In the following there will be explained the flow of actual pilot wafer process, with reference to FIG. 4. At first a pilot wafer after the photoresist development is supplied to the measurement device 140 or 150. In response to an input by a keyboard KB or a bar code card BC, said measurement device asks the registered name of the stepper (EXP1-EXPn) used for the exposure of said pilot wafer, to the MDP 110 (information flow DA).

The MDP 110 finds the MC 100 of the exposure unit used for processing said pilot wafer, from a file STPF based on the registered name of the stepper, and asks the name of the exposure process program to said MC 100 (information flow DB). In response, the selected MC 100 sends back the name of the exposure process program to the MDP 110 (information flow DC). The MDP 110 calls a measurement process program corresponding to said name of the exposure process program by searching the file MPPF, and loads said called program into the measurement devices 140, 150 (information flow DD).

Thus the measurement devices 140, 150 automatically execute the measurements and evaluations required for said pilot wafer. Examples of the measurements conducted by the measurement devices 140, 150 are aberration in alignment and precision of line width in the pattern. The measurement of aberration in alignment is used for evaluating the aberration in center and in rotation of the shots transferred in step-and-repeat process onto the wafer, and there is calculated a parameter which is the same in meaning as the alignment parameter determined at the wafer global alignment (EGA) of the stepper.

Said alignment parameter, and the calculation thereof, are detailedly explained for example in the U.S. Pat. No. 4,780,617. Thus calculated parameter makes it possible to review the precision of EGA of the stepper used for exposing said pilot wafer, and to determine the necessity for correction or modification of the EGA parameter calculated in the stepper.

On the other hand, the measured data on the pattern line width are analyzed for plural shots on the wafer or plural points in each shot, and are used for estimating the excess or deficiency of exposure of the pilot wafer, flatness of the entire wafer, flatness in each shot and offset from the best focus position. In general, the width of a line pattern formed on the photoresist becomes larger or smaller, depending on the focus position and the amount of exposure (dose value).

The data of the above-mentioned measurements are supplied from the measurement devices 140, 150 to the MDP 110 (information flow DE). Based on the data obtained in the measurements of aberration in alignment and of line width, the MDP 110 effects the calculation of the above-mentioned parameter for alignment, determination of necessity for correction, and calculation of correction value in case the correction is necessary, and also calculates other working parameters such as the correction value for exposure, correction value for inclination of a levelling state provided on the wafer stage WST of the stepper, offset in the axial position setting of the wafer determined by the focus sensor, and correction value for the errors resulting from magnification of projection or from distortion.

These amounts of correction or modification are sent to the MC 100 when these parameters are to be corrected or modified (information flow DF). In response the MC 100 adds said amounts of correction or modification to the predetermined parameters, thereby generating, in said MC 100, an optimized exposure process program in which the defects, identified from the pilot wafer process, are produced.

Upon receiving the results of the pilot wafer process, if said results are sufficient with respect to the precision determined for production management, the MC 100 does not effect the parameter modifications mentioned above but processes the 2nd and subsequent wafers in the lot to be processed in continuous manner under the same conditions.

On the other hand, if the results of pilot wafer process are insufficient, the parameters in the exposure process program are rectified as explained above, and the pilot wafer is sent back to the coater-developer CDn for removal of the photoresist and is again subjected to the pilot exposure, measurement and evaluation. This pilot wafer process is repeated until the results of evaluation become acceptable. However, a maximum number of repetitions is determined in advance, as said process cannot be repeated endlessly.

At the pilot wafer process (exposure and measurement), the console of the MDP 110 displays the state of the measurement devices and the latest results of pilot wafer process. The MDP 110 stores and manages the results of pilot wafer process in relation to the file MPPF.

In case the measurement devices 140, 150 can be controlled by communication with the MDP 110, said devices may be remote controlled from the console of the MDP 110.

Figure 5:
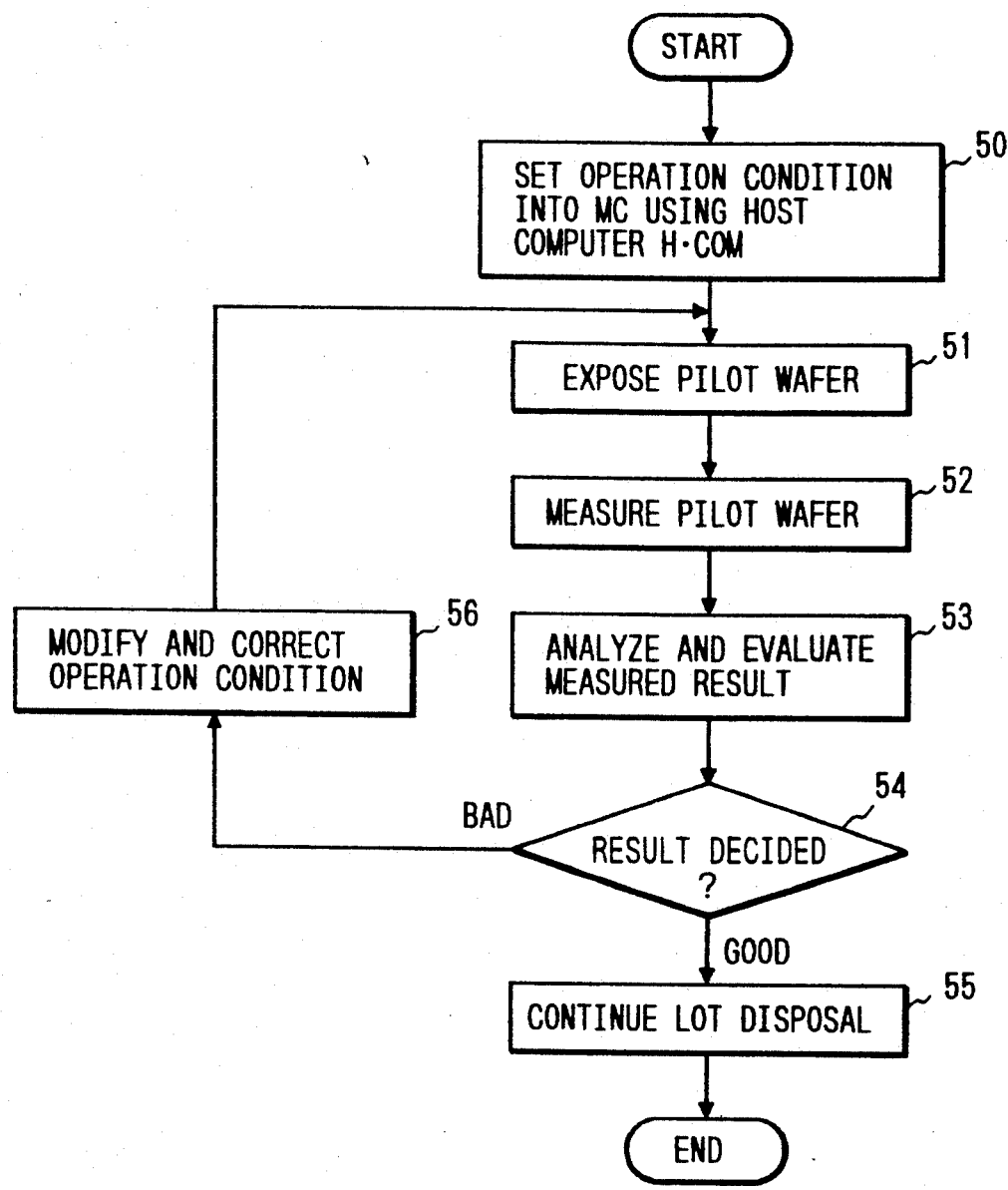
FIG. 5 is a flow chart showing the functions of a first embodiment of the automatic set-up service function.

The above-explained auto set-up service function can be represented in a flow chart shown in FIG. 5, wherein operating conditions shown in steps 50 and 56 include, for example, the aforementioned parameter for alignment and the parameters defining the operations of various units in the exposure step.

Other operating conditions include the selection of plural alignment sensors provided on the stepper, selection of various signal processing algorithms to be used by the alignment sensor, selection of the alignment marks on the wafer, setting of position of the reticle blind for limiting the illuminating light to the pattern area on the reticle, offset settings for the functions for correcting the imaging characteristics (magnification and focus) of the projection lens PL of the stepper for example by fine movement of the field lens or by pressure control, and offset setting for the exposure amount responding to the photoresist film thickness.

Figure 4:
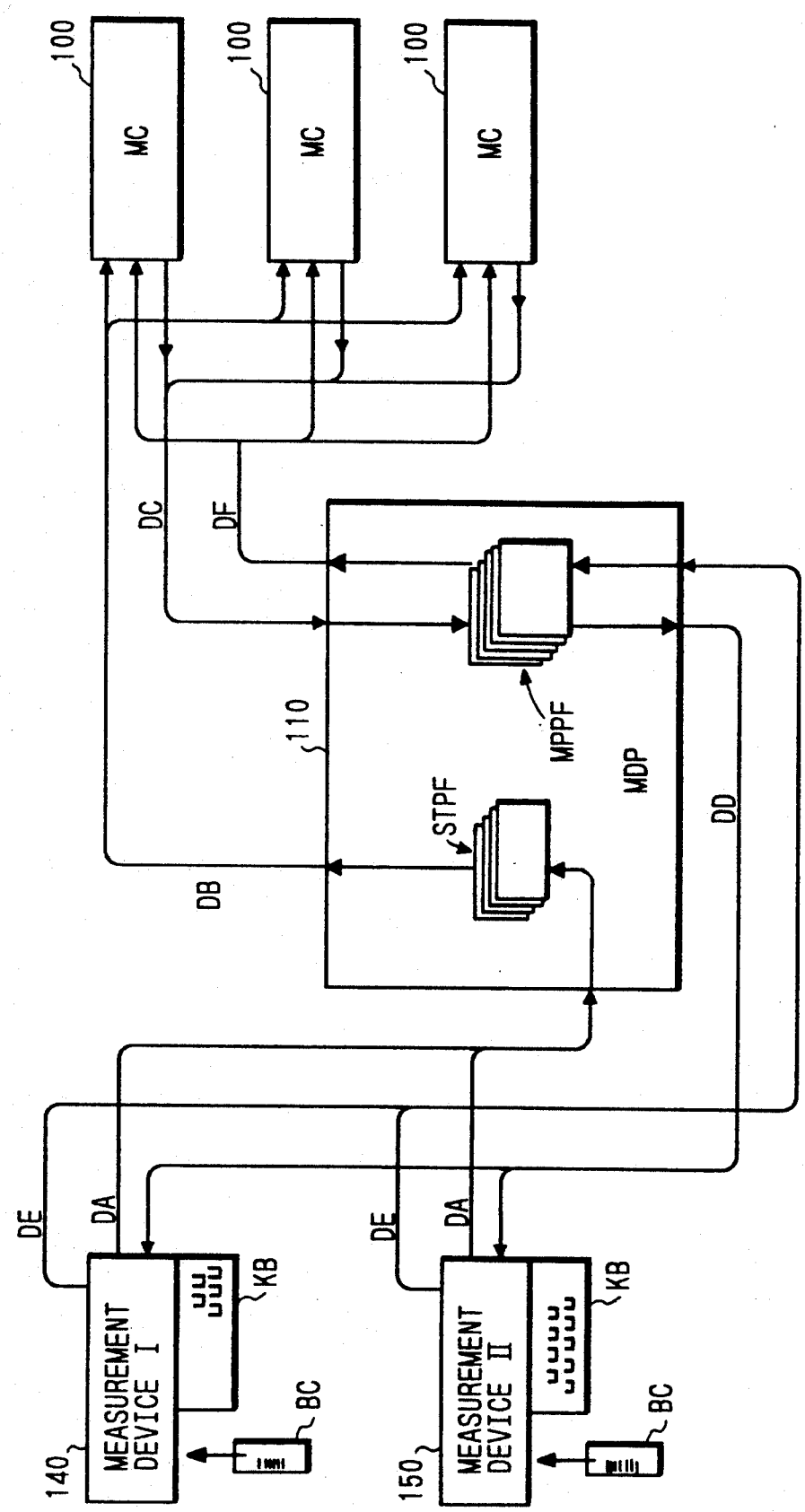
FIG. 4 is a block diagram showing the flow of various information in the execution of automatic set-up service function.

Also the pilot wafer measurement in a step 52 may be conducted, instead of the exclusive measurement devices 140, 150 as shown in FIG. 4, by the steppers EXP-1–EXPn themselves, as detailedly disclosed in the U.S. Pat. No. 4,908,656.

The above-explained auto set-up service function is associated with a drawback that the subsequent lot process (step 55) cannot be initiated until the result of pilot wafer process is evaluated as acceptable in a step 54. This drawback becomes conspicuous as a loss in the throughput in case the exposure process is stable so that the pilot wafer requires only one exposure in most cases. It is therefore conceivable to modify the entire process in the following manner.

Figure 6:
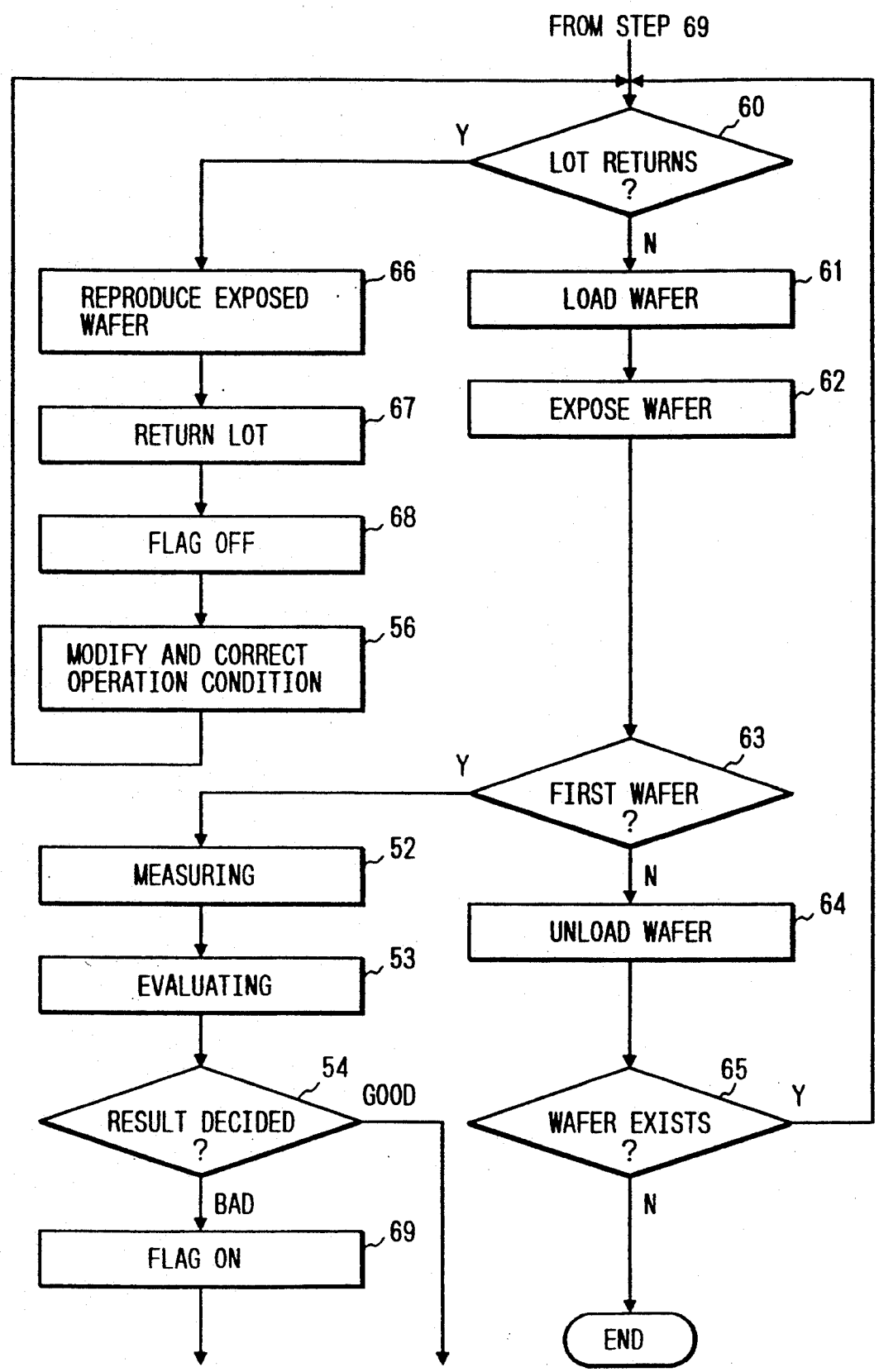
FIG. 6 is a flow chart showing a variation of the first embodiment of the automatic set-up service function.

FIG. 6 is a flow chart modified from the flow shown in FIG. 5. In FIG. 6, steps 60–69 indicate the modified portion, while steps 52–54 and 56 are the same as those in FIG. 5. In the present embodiment, parallel to the processing of the 1 st pilot wafer in a lot, the 2nd and subsequent wafers in said lot are processed in the normal manner, and the processing of the lot is discontinued only when the result of pilot wafer process is identified unacceptable.

At first a step 60 discriminates whether a lot returning operation is executed. The lot returning means an operation of returning the wafers from the first one to the just exposed one, when a flag indicating the unacceptable result of the pilot wafer process is turned on.

The first wafer in the lot proceeds through steps 60, 61 and 62, and, being identified as the first wafer in a step 63, further proceeds to steps 52, 53 and 54. In case the measurement step 52 is conducted in the separate measurement devices 140, 150, the first wafer is taken out from the stepper, so that the MDP 110 executes the steps 60, 61 and 62 in order to expose the second wafer.

The second wafer proceeds from the step 63 to a step 64, whereby the wafer is placed in the 2 nd slot in a cassette in the library WCLn. Then a step 65 discriminates the presence of remaining wafer(s), and, if a remaining wafer is present, the sequence starting from the step 60 is repeated.

When the pilot wafer processed in the steps 52, 53 is identified as acceptable in the step 54, all the wafers in the lot are processed without any change, and the first wafer returns to the first slot in the cassette. On the other hand, if the result is identified as unacceptable in the step 54, a step 69 turns on a flag for lot returning. When the step 60 identifies the on-state of said flag, the MDP 110 cooperates with the MC 100 to return all the wafers from the first one in the lot to the just exposed one to the coater-developer, thereby removing and re-coating the photoresist. This operation is called wafer regeneration, conducted in a step 66.

Then a step 67 returns the regenerated wafers to the unexposed wafer cassette in the library, WCLn, a step 68 turns off the flag, a step 56 effects the modification or correction of operating conditions, and the sequence returns to the step 60.

Such process improves the throughput of the entire process if the probability of defect is sufficiently low, though there is required a longer time once the defect is generated. The lot returning operation can naturally be started earlier by interrupting the operation of the stepper and immediately proceeding to the step 66 as soon as the flag is turned on in the step 69, even if the stepper is in the course of a wafer exposure operation.

In the following there will be explained a second embodiment of the present invention, employing the system shown in FIG. 2. The second embodiment also employs the pilot wafer exposure, but it is not executed according to the exposure process program instructed from the host computer H·COM to the MC 100 but according to the optimum operating conditions estimated from those monitored in the past. For this purpose, the CIS 120 shown in FIG. 2 collectively stores the information on the operating conditions, obtained in the past pilot wafer processes, sorted for each wafer grade to be processed and for each stepper. In the processing of a wafer lot, the MDP 110 (or the MC 100) asks the estimated optimum operating conditions to the CIS 120, based on the wafer grade (for example layer to be processed) in said lot and the stepper name to be employed, and accordingly corrects the operating conditions for pilot exposure.

Such estimation is effective in case the parameters set by the operator in the host computer H·COM are significantly aberrated from the adequate conditions, or in case the lot process is executed for the first time for said wafer grade.

In the following is explained the alignment parameter as one of such estimated optimum operating conditions. In case of determining the mark center position by slicing a signal wave form, obtained by the alignment sensor, with a certain slicing level, the determination of said slicing level requires certain trials, depending on the layer structure of the wafer to be processed and the characteristic of the alignment sensor. However the optimum slicing level can be determined almost without fluctuation, based on the past experiences on the mark on a wafer surface of substantially the same layer structure or subjected to substantially the same steps, Therefore, the MDP 110 sorts the data of wafers of the same grade, processed under similar exposure process programs in the past, prepares the histogram of the slice levels in the alignment of such wafers, and determines the most frequently employed slicing level as the estimated optimum operating condition.

If thus determined optimum condition is different from the condition pre-loaded in the MC 100, the former is selected. In this manner it becomes possible to reduce the probability of obtaining unacceptable result in the evaluation after the pilot wafer exposure.

In the following there is explained the auto set-up service function in a third embodiment, in which the evaluation is made on the wafers after exposure. In the ordinary lithographic process, after the exposure of a lot, all or some of the wafers in said lot are inspected before proceeding to a next step. Said inspection is substantially the same as the steps 52, 53 shown in FIGS. 5 and 6. If the result of said inspection turns out unsatisfactory, the entire lot is subjected to the regeneration as in the step 66. Also in case the result is identified acceptable, the error or tendency within the tolerance is detected, and the obtained data are supplied from the measurement devices 140, 150 through the MDP 110 to the CIS 120 and managed therein collectively.

The data base for the estimated optimum operating conditions, explained in the second embodiment, is constructed by accumulating the data of thus evaluated lots, for each wafer grade and for each stepper. The method of utilization of said data base is the same as in the second embodiment.

In the following there will be explained a fourth embodiment utilizing the system shown in FIG. 2. The present embodiment monitors the events in each stepper, checking the operating status of each stepper by each event, and analyzes the situation of frequent errors, thereby discriminating the necessity for modification or correction on the exposure process program.

The present embodiment deals with the following information, as the events occurring in the course of exposure process:

(a) start and end of reticle reservation;
(b) start and end of reticle inspection for foreign particles;
(c) start and end of reticle replacement;
(d) start and end of lot process;
(e) start and end of pilot exposure;
(f) start and end of main exposure task;
(g) start and end of each wafer development;
(h) start of waiting state;
(i) alarm for error generation.

The information on these events (a)–(i) is transmitted from the MC 100, through the LAN 50, to the MDP 110 and classified therein. The MDP 110 analyzes the classified event information, based on the history of the operating status of each stepper.

At first the MDP 110 prepares the history of operating status of the steppers and displays said history on real time basis on the console. The operating status in the present embodiment includes:

(j) listing of current operating status of steppers;
(k) display of current operating status of a selected stepper;
(l) listing of results, of lot process in each stepper within the same day;
(m) display of results of lot process in a selected stepper within the same day; and
(n) latest error information in a selected stepper.

These history data (j)–(n) are stored in succession in a memory medium (rigid disk, optical disk etc.) in the MDP 110.

The MDP 110 analyzes the generation of events in each stepper, utilizing thus stored history data (j)–(n). Said history data are processed on a daily basis, and the MDP 110 is equipped with the following three analyzing functions in the form of softwares:

(1) Function for generating event tracing information, gathering and time-sequentially displaying all the events (a)–(i) in the course of operation of each stepper;

(2) Function for generating sorted event information in which the generated events are sorted according to each process unit, based on said event tracing information; wherein the process units and events are defined as follows:

(2-1) Reticle replacement:
start and end time;
end status (normal or error);
generated error statistics;
(2-2) Lot process:
start and end time;
end status (normal or error);
lot name;
product (device) name and process step name;
number of processed wafers;
generated error statistics;
(2-3) Waiting state:
generated error statistics;

(3) Function for generating sorted operating information for each apparatus, based on said sorted event information.

In the present embodiment there are generated data on the number of processed lots, number of processed wafers, number of reticle replacements, number of failures in the particle inspections or reticles, number of errors generated in the steppers and number of errors generated in the coater-developers.

The above-mentioned functions (1), (2) and (3) make it possible to comprehend the operating status of each stepper in a day, and to establish a more effective process program for the lots to be processed next day. Particularly the error generation may become a serious problem in the device production, and, if the same error is repeated in a particular stepper or a particular process step, there is immediately identified review or repair required for said process step or the function or precision of the stepper involved in said process step.

The present invention has been explained by embodiments thereof, but the system shown in FIG. 2 may also be utilized for evaluation of the performance of the stepper utilizing a test reticle (a device reticle may be used also in certain cases).

The items of said evaluation are mostly the precision of overlay of or of alignment, but also include the intensity distribution of illuminating light, control precision of correcting means for deteriorating of imaging performance resulting from heat accumulation in the projection lens, distortion and image plane curvature of the projection lens, flatness of the wafer holder, stepping precision and orthogonality of the wafer stage, position error in the moving mirror for laser interferometer, time required for exposure, alignment, wafer exchange or reticle exchange, stability of base line (distance between the center of exposure field and the alignment sensor) in time and in temperature, and focusing precision.

These items are also evaluated periodically and the results are stored in succession in the MDP 110. Such results of evaluations are principally classified for each stepper, and accumulated as basic data for the management of matching among the steppers, and for maintenance and precision control of each stepper. Such detailed data specific to each stepper are conventionally managed by the computer CMP·En of each stepper, but, according to the present invention, the MDP 110 collectively controls the specific data of all the steppers constituting a production line, whereby it is rendered possible to select an optimum stepper matching the exposure process program, or to achieve more effective stepper operation throughout the entire line.

It is also possible to constantly monitor the eventual variation in the specific constants of the stepper in the course of lot process, to judge whether thus monitored values are aberrated from the values selected by the operator or defined in the designing of the apparatus, and, in case of aberration from the tolerable range, to correct the operating parameters of the stepper in order to prevent the resulting troubles.

For example, the exposure light amount (dose value) in the exposure operation of the stepper is controlled either in an integrator control mode in which the total amount of exposure to a shot on the wafer is monitored by integration with a photosensor and the shutter is closed when a desired value is reached, or a timer control mode in which the intensity of the light source is measured in advance and the shutter open time corresponding to the necessary exposure is determined by calculation. The integrator control mode automatically adjusts the shutter open time so as to always achieve a predetermined exposure per shot even when the intensity of the light source fluctuates, but is more cumbersome in the management of throughput since the exposure time (shutter open time) per shot may be different between the start and the end of a lot due to the eventual variation in the intensity of the light source.

On the other hand, the timer control mode is simpler in the management of throughput, but the fluctuation in the intensity of the light source has to be within a predetermined tolerance (for example several percent within a lot). For this purpose there is provided a function (circuit or program) for checking the output of the photosensor monitoring the intensity of the light source as a specific constant of the stepper not only at the pilot exposure but also during the lot process, and to discriminate whether the output obtained at the pilot exposure is maintained within the tolerance during the lot process. If a variation in the intensity of the light source is detected by said function in the course of a lot process, the MDP 110 modifies, even in the course of a lot process, the exposure time set in the MC 100 by the auto set-up service function, thereby correcting the exposure time for the wafer processed in the stepper. Otherwise the power supplied to the light source may be finely regulated in such a manner that the light intensity itself is maintained within said tolerance.

It is thus rendered possible to prevent deteriorations in various precisions that may occur in the course of a lot process, by monitoring the variation in the constants specific to the stepper by the MDP 110 through the LAN 50. Other variations in such constants include the variation in the control precision (or required time) in the automatic focusing utilizing a focus sensor, variation in the precision of measurement with the alignment sensor, variation in the magnification or in the focus plane of the projection lens, or variation in the running precision (such as yawing) of the wafer stage, and a similar method is applicable to these variations.

As explained in the foregoing, the present invention can dynamically modify the operating conditions not only at the processing of a pilot wafer at the start of a lot but also during the main exposure operation for the entire lot, thereby significantly improving the work rate and yield of the entire line.

The present invention, while maintaining the conventional lithographic process management with the host computer H·COM, collectively monitors the operation status of the exposure apparatus (steppers or aligners) in the lithographic process and makes it possible when necessary, to modify or correct the parameters set in such exposure apparatus independently from the control by said host computer.

Consequently the operator is not required to check the quality of precision of the processed wafers and to reset the parameters on each exposure apparatus, and the optimized operating conditions are maintained stable for each exposure apparatus.

What is claimed is:

1. A lithography system provided with plural exposure apparatus, which are operable independently, to be employed in a lithography process, and a process management apparatus for providing exposing procedure information and for controlling supply of masks and sensitive substrates to be used in each of said plural exposure apparatus, and independently directing operation of each of said plural exposure apparatus in connection with the supply of said masks and sensitive substrates thereof, said lithography system comprising:

(a) an operating computer provided in each of said plural exposure apparatus, the operating computers automatically controlling, when exposing procedure information for a series of exposure operations is received, actions of systems for changing masks and sensitive substrates at the exposure apparatus, and for controlling alignment systems and systems for printing patterns of said masks on said sensitive substrates;

(b) first communication linkage means connecting each of said operating computers with said process management apparatus for sending exposing procedure information to an operating computer of a selected exposure apparatus;

(c) a data processor, provided independently of said process management apparatus and of said operating computers, for performing gathering of a plurality of data, data processing and data storing;

(d) second communication linkage means for connecting, independently of said first communication linkage means, each of said operating computers and said data processor; and (e) data communication means, which sends through said second communication linkage means to said data processor, data regarding conditions of systems of said selected exposure apparatus activated according to said exposing procedure information and data regarding desired conditions according to said exposing procedure information, and which sends through said second communication linkage means to the operating computer of said selected exposure apparatus, data stored or processed in said data processor, whereby a selected operating computer can correct, on the basis of received data, a part of received exposing procedure information or an action of a system of the selected exposure apparatus.

2. A lithography information control system for gathering and storing information required in plural exposure machines which are operable independently and are respectively instructed in accordance with process programs obtained from a host computer, said information control system comprising:

(a) internal computers respectively provided in said plural exposure machines, each of said internal computers being adapted to activate, in its exposure machine, at least one of a system for changing masks and sensitive plates, a system for aligning a mask and a sensitive plate, and a system for exposing a plate to a pattern of a mask, and each of said internal computers creating first data representative of operating status of those systems;

(b) a plurality of first communication paths provided between said host computer and each of said internal computers, for transmitting second data, in accordance with said process programs, for operating the systems of the exposure machines of the corresponding internal computers;

(c) a data processor which continuously gathers said first data and said second data, collectively controls information regarding operating conditions and error status of each system produced in each of said exposure machines, and produces information regarding deviation from desirable operating conditions of each exposure machine; and (d) a plurality of second communication paths provided between a portion of each of said first communication paths and said data processor, for transmitting to said data processor said first and second data and for transmitting to said internal computers third data based on past deviation information accumulated in said data processor for each of said exposure machines.

3. A system according to claim 2, wherein said first communication paths have data communication means provided between said host computer and said internal computers to exchange data with said second communication paths.

4. A lithography information control system for gathering and controlling information required in an exposure process including a host computer which collectively manages a lithography process program and provides instructions relating thereto and plural exposure machines operated by instructions from said host computer, or by information newly obtained in said exposure process, comprising:

(a) machine control means for analyzing a process program instructed by said host computer and generating operating information required in the operation of each of said plural exposure machines;

(b) a first communication linkage provided between said host computer and said machine control means to send instructions relating to said process program to said machine control means;

(c) master data processing means for gathering operating information from said machine control means, independently of the managed process by said host computer, and analyzing thus gathered information;

(d) measurement means for measuring a pattern formed on an exposed plate processed in at least a selected one of said plural exposure machines and transmitting the result of the measurement to said master data processing means independently of the managed process by said host computer;

(e) a second communication linkage, independent of said first communication linkage, for connecting said machine control means to said measurement means and to said master data processing means and capable of performing two-way communication; and (f) information modifying means provided in said master data processing means, adapted to modify at least a part of the gathered operating information according to a difference between the result of measurement obtained from said measurement means and a target value in said process program, and transmitting thus modified operating information to said machine control means through said second communication linkage;

whereby each of said exposure machines can maintain optimum exposure process in response to said modified operating information, without interrupting collective management by the process program of said host computer.

5. A lithography information control system including plural exposure machines each including an alignment system for alignment of a substrate to be exposed, and a host computer for controlling individual operations of said plural exposure machines according to a process program for process management, comprising:

(a) a first communication linkage between said host computer and each of said plural exposure machines, at least a selected one of said exposure machines being controlled by said process program through said first communication linkage;

(b) master data processing means, which is independent of said host computer, for keeping information needed when said at least one exposure machine performs a pilot exposure process by the use of its alignment system, and information needed when a pattern on a substrate exposed through said pilot exposure process is measured, and for calculating an alignment accuracy of said alignment system based on the measurement result;

(c) a second communication linkage between said master data processing means and each of said exposure machines and which is independent of said first communication linkage, for sending to said master data processing means information of said process program which controls said at least one exposure machine and for sending to said at least one exposure machine information produced by said master data processing means;

(d) measuring means which measures a pattern formed on a substrate through said pilot exposure process, and sends a measurement result to said master data processing means for a calculation of alignment accuracy; and (e) information modifying means provided in said master data processing means for sending to said at least one exposure machine, through said second communication linkage, information for modifying a portion of an operating condition of said at least one exposure machine controlled by said process program, when a measured alignment accuracy obtained through said pilot exposure process does not reach an accuracy required by said process program.

* * * * *